(12) United States Patent
Jung et al.

(10) Patent No.: US 11,169,449 B2
(45) Date of Patent: Nov. 9, 2021

(54) MEASURING APPARATUS FOR VACUUM CHAMBER AND MEASURING SYSTEM INCLUDING THE SAME

(71) Applicant: Samsung Electronics Co., Ltd., Suwon-si (KR)

(72) Inventors: Daesung Jung, Pohang-si (KR); Younsok Choi, Hwaseong-si (KR); Jongmin Song, Seoul (KR); Minho Kang, Seoul (KR); Sangyoon Soh, Yongin-si (KR); Hohyun Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 111 days.

(21) Appl. No.: 16/655,973

(22) Filed: Oct. 17, 2019

(65) Prior Publication Data
US 2020/0333716 A1 Oct. 22, 2020

(30) Foreign Application Priority Data
Apr. 18, 2019 (KR) .......................... 10-2019-0045643

(51) Int. Cl.
*G03F 7/20* (2006.01)
*H01L 21/67* (2006.01)
(Continued)

(52) U.S. Cl.
CPC ............ *G03F 7/70858* (2013.01); *G03F 1/44* (2013.01); *G03F 1/62* (2013.01); *G03F 7/7085* (2013.01);
(Continued)

(58) Field of Classification Search
CPC .............. G03F 7/70858; G03F 7/7085; G03F 7/70841; G03F 7/7055; G03F 7/70558;
(Continued)

(56) References Cited

U.S. PATENT DOCUMENTS 6,421,013 B1 * 7/2002 Chung ............. G06K 19/07749
343/700 MS
6,614,235 B2 9/2003 Kraz
(Continued)

FOREIGN PATENT DOCUMENTS

| JP | 2006041094 | 2/2006 |
|---|---|---|
| JP | 2018106188 | 7/2018 |
| KR | 100885332 | 2/2009 |

OTHER PUBLICATIONS

English translation of JP2006-041094, published Feb. 9, 2006. (Year: 2006).*

*Primary Examiner* — Christina A Riddle
(74) *Attorney, Agent, or Firm* — Myers Bigel, P.A.

(57) ABSTRACT

A measuring apparatus for a vacuum chamber capable of accurately measuring physical properties or quantities in the vacuum chamber in an exposure process in real time, and a measuring system including the measuring apparatus are described herein. The measuring apparatus includes: a body having a shape of an exposure mask used in an exposure process; and a measuring element in an interior of the body or on a first surface of the body. When the measuring apparatus is positioned in a vacuum chamber during the exposure process, the measuring apparatus is configured to measure physical properties in the vacuum chamber using the measuring element. The body or the measuring element is configured to withstand a vacuum in the vacuum chamber including resisting or preventing physical deformation of the body or the measuring element due to the vacuum.

15 Claims, 8 Drawing Sheets

(51) Int. Cl.
*G03F 1/44* (2012.01)
*G03F 9/00* (2006.01)
*G03F 1/62* (2012.01)

(52) U.S. Cl.
CPC ........ *G03F 7/70841* (2013.01); *G03F 9/7088* (2013.01); *H01L 21/67253* (2013.01)

(58) Field of Classification Search
CPC .. G03F 7/70591; G03F 7/70691; G03F 7/707; G03F 7/70708; G03F 7/70733–7075; G03F 7/708; G03F 7/70808; G03F 7/70825; G03F 7/70833; G03F 7/70866; G03F 7/70875; G03F 7/70883; G03F 7/70891; G03F 7/70908–70941; G03F 7/7095; G03F 7/70958; G03F 7/70975; G03F 7/70983; G03F 7/70991; G03F 7/70133; G03F 7/70033; G03F 1/42; G03F 1/44; G03F 1/62; G03F 1/66; G03F 1/84; G03F 9/7088; G03F 9/7007; G03F 9/7015; G03F 9/7019; G03F 9/7073–7084; H01L 21/67253
USPC ........ 355/18, 30, 52–55, 67–77, 133; 430/5, 430/22, 30, 311–313; 700/121; 438/14, 438/585; 250/491.1, 492.1, 492.2, 250/492.22, 493.1, 504 R, 505.1, 515.1, 250/517.1; 356/51, 256
See application file for complete search history.

(56) References Cited

U.S. PATENT DOCUMENTS

| | | | |
|---|---|---|---|
| 6,691,068 B1 | 2/2004 | Freed et al. | |
| 6,693,432 B2 | 2/2004 | Kraz | |
| 6,747,282 B2 | 6/2004 | Kroon et al. | |
| 6,817,602 B2 | 11/2004 | Charles et al. | |
| 6,884,984 B2 | 4/2005 | Ye et al. | |
| 6,969,837 B2 | 11/2005 | Ye et al. | |
| 7,127,362 B2 * | 10/2006 | Mundt | G05B 19/41865 702/56 |
| 7,171,334 B2 | 1/2007 | Gassner | |
| 7,215,408 B2 | 5/2007 | Hamatani et al. | |
| 7,352,441 B2 | 4/2008 | Ogusu | |
| 7,426,017 B2 | 9/2008 | Kondo | |
| 7,564,017 B2 | 7/2009 | Hunsche et al. | |
| 7,675,605 B2 | 3/2010 | Moest | |
| 7,749,666 B2 | 7/2010 | Gassner et al. | |
| 7,790,340 B2 | 9/2010 | Progler | |
| 7,910,269 B2 | 3/2011 | Progler | |
| 8,136,055 B2 * | 3/2012 | Anderson | G03F 7/7085 716/51 |
| 8,514,395 B2 | 8/2013 | Shibazaki | |
| 9,164,388 B2 | 10/2015 | Chilese et al. | |
| 9,356,822 B2 | 5/2016 | Jensen | |
| 9,383,660 B2 | 7/2016 | Yoshihara et al. | |
| 9,958,788 B2 | 5/2018 | Prosyentsov et al. | |
| 2004/0225462 A1 * | 11/2004 | Renken | H01L 21/6732 702/94 |
| 2006/0221316 A1 * | 10/2006 | Yamamoto | G03F 7/706 355/53 |
| 2007/0207393 A1 * | 9/2007 | Ikenaga | G03F 1/84 430/5 |
| 2008/0050847 A1 | 2/2008 | Gluschenkov et al. | |
| 2008/0261123 A1 * | 10/2008 | Progler | G03F 1/44 430/5 |
| 2011/0180108 A1 * | 7/2011 | Pan | G03F 1/66 134/21 |
| 2012/0018347 A1 * | 1/2012 | Ku | H01L 21/67353 206/710 |
| 2012/0074514 A1 * | 3/2012 | Nguyen | H01L 21/67253 257/467 |
| 2015/0160550 A1 * | 6/2015 | Kim | G03F 1/38 216/47 |
| 2017/0031142 A1 * | 2/2017 | Kim | G02B 19/0095 |
| 2017/0115167 A1 * | 4/2017 | Fujiwara | H02J 7/35 |

* cited by examiner

MEASURING APPARATUS FOR VACUUM CHAMBER AND MEASURING SYSTEM INCLUDING THE SAME

CROSS-REFERENCE TO RELATED APPLICATION

This application claims the benefit of Korean Patent Application No. 10-2019-0045643, filed on Apr. 18, 2019 in Korean Intellectual Property Office, the disclosure of which is incorporated by reference herein in its entirety.

BACKGROUND

The inventive concept relates to a measuring apparatus, and more particularly, to a measuring apparatus and a system which are used in a chamber in an exposure process.

In semiconductor manufacturing lines, the exposure process can have the greatest influence on the productivity and reliability of semiconductor products, and is one of the important factors for improving yield. As semiconductor processes have become finer, exposure methods and exposure equipment have been developed and modified, and recent exposure equipment has a substantially different form from past exposure equipment. For example, recent exposure equipment uses a vacuum chamber, and also uses a high power light source and an electrostatic chuck. As finer semiconductor processes are performed using such exposure equipment, various physical properties or quantities, which have been relatively unrelated to or less relevant to the past exposure equipment, are affecting the yield.

SUMMARY

The inventive concept provides a measuring apparatus for a vacuum chamber capable of accurately measuring physical properties or quantities in a vacuum chamber in an exposure process in real time, and a measuring system including the measuring apparatus.

According to an aspect of the inventive concept, there is provided a measuring apparatus for a vacuum chamber, the measuring apparatus including: a body having a shape of an exposure mask used in an exposure process; and a measuring element in an interior of the body or on a first surface of the body. When the measuring apparatus is positioned in a vacuum chamber during the exposure process, the measuring apparatus is configured to measure physical properties in the vacuum chamber using the measuring element. The body or the measuring element is configured to withstand a vacuum in the vacuum chamber including resisting or preventing physical deformation of the body or the measuring element due to the vacuum.

According to another aspect of the inventive concept, there is provided a measuring apparatus for a vacuum chamber, the measuring apparatus including: a measuring element; a body having a shape of an exposure mask, wherein the measuring element is in an interior of the body or on a first surface of the body; and at least one alignment mark on a second surface of the body. The measuring apparatus is configured to be positioned in a vacuum chamber during an exposure process and to measure physical properties in the vacuum chamber using the measuring element. When the measuring apparatus is positioned in the vacuum chamber, an alignment state of the measuring apparatus in the vacuum chamber is checked using the alignment mark.

According to another aspect of the inventive concept, there is provided a measuring system including: a measuring apparatus for a vacuum chamber, the measuring apparatus including a measuring element and a body having a shape of an exposure mask, the measuring element in the body; and a carrier configured to receive the measuring apparatus and move the measuring apparatus into a vacuum chamber of exposure equipment. The measuring apparatus is configured to measure physical properties in the vacuum chamber using the measuring element during an exposure process.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
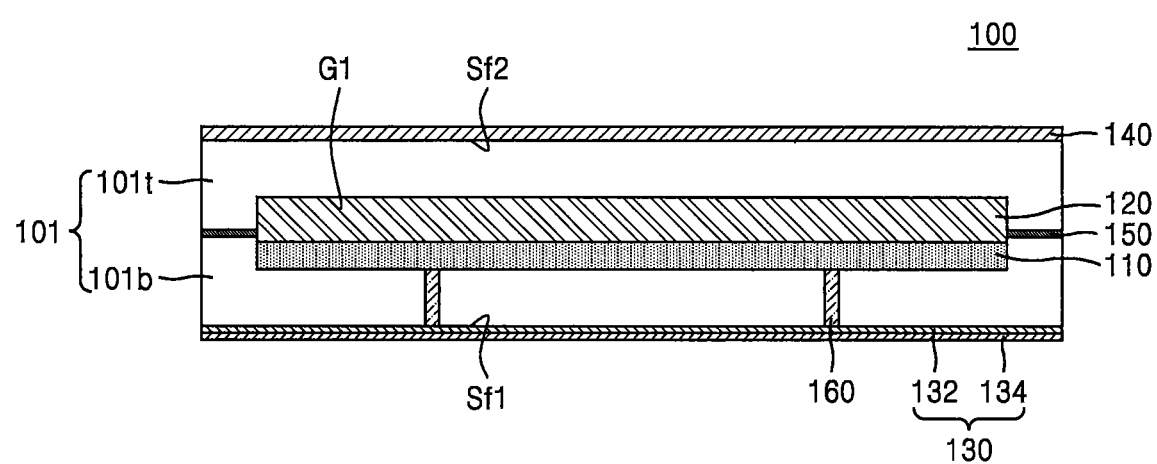
FIG. 1 is a cross-sectional view of a measuring apparatus for a vacuum chamber, according to an embodiment of the inventive concept.
Figure 2:
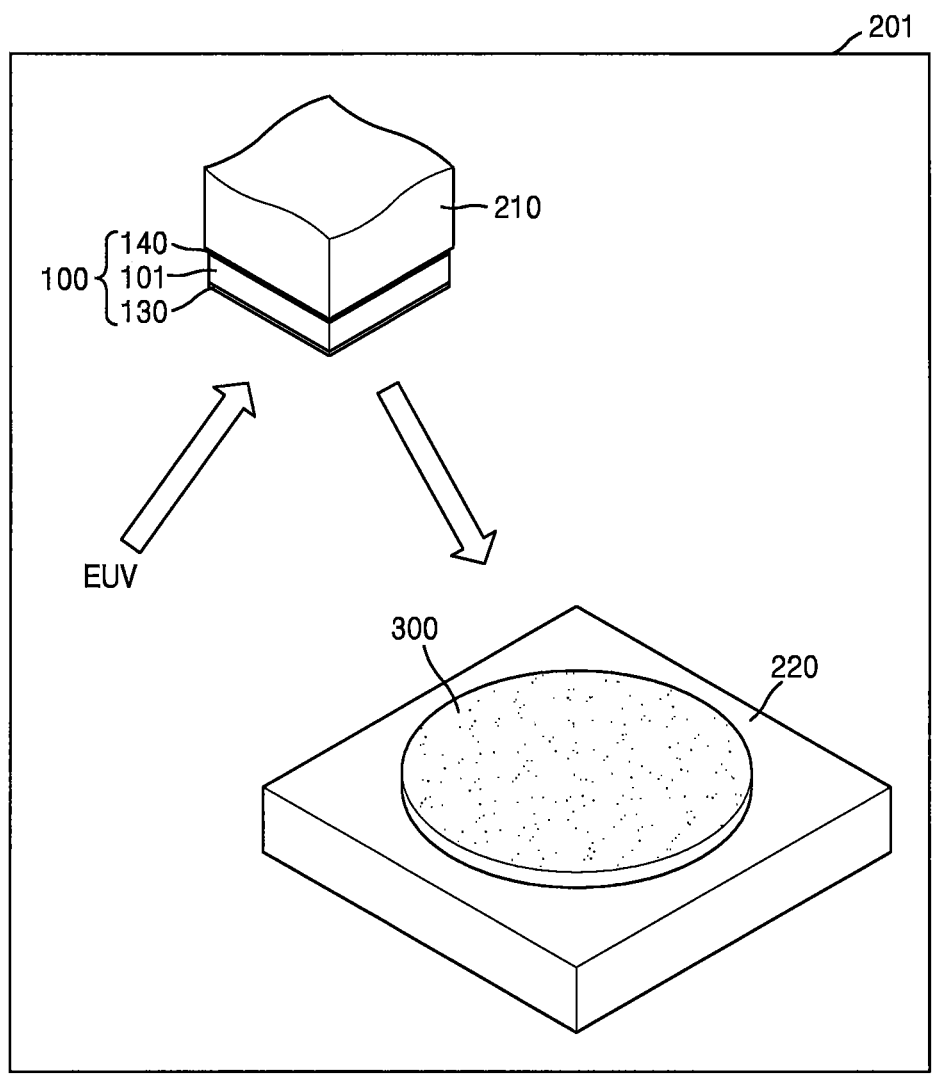
FIG. 2 is a conceptual diagram showing a state where the measuring apparatus of FIG. 1 is inserted into a vacuum chamber.

FIG. 1 is a cross-sectional view of a measuring apparatus 100 for a vacuum chamber, according to an embodiment of the inventive concept, and FIG. 2 is a conceptual diagram showing a state where the measuring apparatus 100 of FIG. 1 is inserted into a vacuum chamber 201.

Referring to FIGS. 1 and 2, the measuring apparatus 100 according to the present embodiment may include a body 101, a measuring element or measuring device 110, a filler 120, a protective layer 130, a chucking metal layer 140, and an adhesive layer 150.

The body 101 may have the shape of an exposure mask used in an exposure process. For example, the body 101 may have a rectangular or square plate shape. However, the shape of the body 101 is not limited to a rectangular or square plate shape. The body 101 may include a material similar to that of the exposure mask; for example, the body 101 may include quartz. However, the material of the body 101 is not limited to quartz. For example, the body 101 may include a quartz-like material such as glass or silicon rather than quartz.

In the measuring apparatus 100 according to the present embodiment, the body 101 may include an upper body 101$t$ and a lower body 101$b$. A first groove or recess G1 may be formed in the upper body 101t and the lower body 101b, and the measuring element 110 and the filler 120 may be arranged in the first groove G1. The upper body 101t and the lower body 101b may be coupled to each other by or through the adhesive layer 150 at outer portions thereof, and thus, the measuring element 110 and the filler 120 may be sealed from the outside.

The measuring element 110 may measure various physical characteristics, properties, or quantities related to the state in the vacuum chamber 201 in an exposure process, in particular an extreme ultra-violet (EUV) exposure process. Here, the physical quantities related to the state in the vacuum chamber 201 may be, for example, temperature, electric field, infrared radiation (IR), pressure, intensity of light, characteristics of light, etc. in the vacuum chamber 201. However, physical quantities that may be measured through the measuring element 110 are not limited to the above-mentioned physical quantities.

The measuring element 110 may have a structure in which a plurality of components are mounted on one board having the shape of a plate. Furthermore, the measuring element 110 may have a structure in which the measuring element 110 is divided into partial measuring elements. The measuring element 110 may include a plurality of measuring elements (also referred to herein as partial measuring elements). Each of the partial measuring elements may have a structure in which the components of each partial measuring element are mounted on a small board, and the Partial measuring elements may be connected to each other via wiring formed in the body 101. The components of the measuring element 110 are described in more detail below with reference to FIG. 5.

The measuring element 110 may be located in the first groove G1 in the body 101. As shown in FIG. 1, the measuring element 110 may have the same horizontal size as the first groove G1. However, according to an embodiment, the measuring element 110 may have a smaller horizontal size than the first groove G1.

The filler 120 may be located on the measuring element 110 in the first groove G1 of the body 101. The filler 120 may be on the top of the measuring element 110 or on an upper surface of the measuring element 110. According to an embodiment, the horizontal size of the measuring element 110 may be less than that of the first groove G1 and in this case, the filler 120 may be arranged on the side of the measuring element 110 as well as on the top of the measuring element 110. The filler 120 may include, for example, an insulating material such as an epoxy material. However, the material of the filler 120 is not limited to an epoxy material.

The filler 120 may fill a space other than the measuring element 110 in the first groove G1 to cope with or withstand external vacuum. For example, the filler 120 may fill and support the first groove G1 to resist or prevent physical deformation such as bending of the body 101 and/or the measuring element 110 by external vacuum. In addition, the filler 120 may maintain the positions or states of the components in the measuring element 110 as they are, thereby preventing the measuring element 110 from being damaged. That is, the filler 120 may protect the body 101 and/or the measuring element 110 from a vacuum. As used herein, the expression "and/or" includes any and all combinations of one or more of the associated listed items.

The protective layer 130 may be formed on a lower surface Sf1 of the body 101. The lower surface Sf1 of the body 101 may be a downward facing surface when the measuring apparatus 100 for a vacuum chamber is mounted on the electrostatic chuck 210 of the vacuum chamber 201. In addition, the lower surface Sf1 of the body 101 may be a surface to which EUV light is irradiated and from which the EUV light is reflected, as shown in FIG. 2.

The protective layer 130 may protect the body 101 and/or the measuring element 110 from plasma, chemicals, EUV light, and the like. For reference, plasma may be generated in the vacuum chamber 201 during an exposure process. That is, during the exposure process, a gas such as $H_2$ may flow under the exposure mask and plasma may be generated as EUV light is irradiated to the gas such as $H_2$. Accordingly, in general, a protective layer for protection against plasma may be formed on the exposure mask, and also in the measuring apparatus 100 according to the present embodiment, and the protective layer 130 having such a function may be formed on the body 101. The exposure mask, and the measuring apparatus 100 according to the present embodiment, may be exposed to chemicals in a cleaning process after use. Therefore, in the measuring apparatus 100 according to the present embodiment, the protective layer 130 for protection against chemicals may be formed on the body 101.

In a EUV exposure process, EUV light may be reflected by the exposure mask and may be irradiated onto a wafer 300 on a stage 220 that is a EUV exposure target. As shown in FIG. 2, the measuring apparatus 100 according to the present embodiment may have the same structure as that of the exposure mask and may be mounted on the electrostatic chuck 210 like the exposure mask. Therefore, EUV light may be irradiated to the measuring apparatus 100 according to the present embodiment. EUV light is well absorbed in most materials and may also damage a corresponding material due to the high energy of the EUV light. Therefore, the protective layer 130 for protecting the body 101 and/or the measuring element 110 from the EUV light may be formed on the body 101.

The protective layer 130 may include, for example, a first protective layer 132 and a second protective layer 134. The first protective layer 132 may include a layer protecting the body 101 and/or the measuring element 110 from EUV light. More specifically, the first protective layer 132 may include a layer that reflects EUV light. Accordingly, the first protective layer 132 may have a material and a structure similar to those of a reflective layer on a EUV mask. For example, the first protective layer 132 may include a Mo/Si multilayer. However, the material and structure of the first protective layer 132 are not limited to those of the Mo/Si multilayer.

The second protective layer 134 may include a layer that protects the body 101 and/or the measuring element 110 from plasma and/or chemicals. Accordingly, the second protective layer 134 may include a material resistant to plasma and/or chemicals. For example, the second protective layer 134 may include Au/Pt or include an epoxy resin resistant to plasma and/or chemicals. However, the material of the second protective layer 134 is not limited to the above-mentioned materials. When the second protective layer 134 includes Au/Pt, a metal layer such as a Cr layer may be further formed between the second protective layer 134 and the body 101 to facilitate deposition on the body 101.

Although an example in which the protective layer 130 includes two layers has been described, the structure of the protective layer 130 is not limited thereto. For example, the protective layer 130 may include one layer or three or more layers depending on a desired function. When the protective layer 130 includes one layer, the protective layer 130 may perform one of the two functions of the first protective layer 132 and the second protective layer 134, or may perform both functions, e.g., at the same time.

According to an embodiment, in the measuring apparatus 100 for a vacuum chamber, the protective layer 130 may be omitted. For example, when the measuring apparatus 100 for a vacuum chamber is used in an environment where EUV light is not irradiated or when the body 101 has a certain degree of protection function, a separate protective layer may not be used.

The chucking metal layer 140 may be formed on an upper surface Sf2 of the body 101. The chucking metal layer 140 may allow the measuring apparatus 100 for a vacuum chamber to be fixed to the electrostatic chuck 210 in the vacuum chamber 201 by electrostatic force. According to an embodiment, a protective layer may be further formed on the chucking metal layer 140, or between the chucking metal layer 140 and the body 101.

As described above, the upper body 101t and the lower body 101b may be adhesively coupled by the adhesive layer 150 and the measuring element 110 in the first groove G1 may be sealed from the outside via the adhesive layer 150. The adhesive layer 150 may include an epoxy material that may cope with, withstand, or resist, for example, vacuum, plasma, chemicals, or the like.

Through vias passing through the lower body 101b may be formed, and wirings 160 extending through the through vias may be arranged in the lower body 101b. The wirings 160 may electrically connect the measuring element 110 to an external element or device. According to an embodiment, the wiring 160 may be omitted and the measuring element 110 may be wirelessly connected to an external device, e.g., via radio. It is shown in FIG. 1 that the through vias and the wirings 160 are located in the lower body 101b, but according to an embodiment, the through vias and the wirings 160 may be located in the upper body 101t.

The measuring apparatus 100 according to the present embodiment may include the body 101 having a shape similar to that of the exposure mask and the measuring element 110 located in the body 101. In addition, the measuring element 110 may cope with or withstand a vacuum state in the vacuum chamber 201 through the body 101, the protective layer 130, the adhesive layer 150, and the like and may be protected from plasma, chemicals, and EUV light. Furthermore, the measuring apparatus 100 for a vacuum chamber may be fixed to the electrostatic chuck 210 of the vacuum chamber 201 in the same manner as the exposure mask through the chucking metal layer 140. Therefore, the measuring apparatus 100 according to the present embodiment may have substantially the same structure as the exposure mask and may be put into the vacuum chamber 201 in an exposure process, for example, a EUV exposure process, to accurately measure the state of the vacuum chamber 201 in real time.

The exposure process using a vacuum chamber in semiconductor manufacturing lines, especially the EUV exposure process, has perhaps the greatest influence on the productivity and reliability of semiconductor products and is one of the most important factors in improving the yield of semiconductor products. As described above, in the EUV exposure process, a finer process is performed using a vacuum chamber, a high power light source, an electrostatic chuck, and the like. In the EUV exposure process, various physical properties or quantities, which have been relatively unrelated to or less relevant to the existing exposure processes, may affect the yield. Since the EUV exposure process is performed in a vacuum state in a vacuum chamber, it may be difficult to accurately measure physical quantities in the vacuum chamber due to vacuum, plasma, electrical problems, and the like.

However, as the measuring apparatus 100 according to the present embodiment has the same characteristics and shape as those of the exposure mask used in the EUV exposure process and is mounted on the electrostatic chuck 210 of the vacuum chamber 201, the measuring apparatus 100 for a vacuum chamber may accurately measure various physical properties or quantities such as temperature, electric field, IR, pressure, intensity of light, characteristics of light, etc. in the vacuum chamber 201. Therefore, the measuring apparatus 100 according to the present embodiment may greatly improve the productivity and reliability of a product manufactured through the EUV exposure process.

FIGS. 3A to 3E are cross-sectional views of measuring apparatuses or measuring devices 100a, 100b, 100c, 100d, and 100e for vacuum chambers, according to embodiments of the inventive concept. Descriptions already given above with reference to FIGS. 1 and 2 may be briefly described or omitted in the interest of brevity.

Figure 3A:
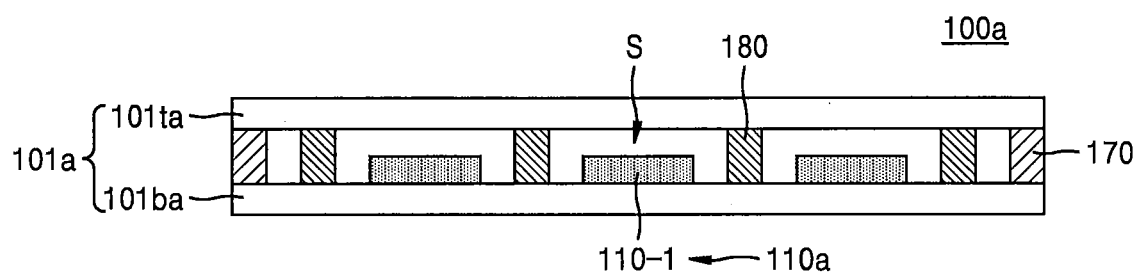
FIGS. 3A to 3E are cross-sectional views of measuring apparatuses for vacuum chambers, according to embodiments of the inventive concept.

Referring to FIG. 3A, the measuring apparatus 100a according to the present embodiment may include a body 101a, a measuring element 110a, a sealing dam 170, and a post 180.

The body 101a may include an upper body 101ta and a lower body 101tb, like the body 101 of the measuring apparatus 100 of FIG. 1. The upper body 101ta and the lower body 101tb may have flat plate shapes. The body 101a may have a structure in which the upper body 101ta and the lower body 101ba are coupled to each other by or through a sealing dam 170 at outer portions thereof, and thus, a groove or recess may not be formed in the body 101a. However, according to an embodiment, a groove or recess may be formed in the body 101a.

As shown in FIG. 3A, the measuring element 110a may include a plurality of measuring elements 110-1 or be divided into partial measuring elements 110-1 and located in the body 101a. The partial measuring elements 110-1 may include respective components for measuring physical properties or quantities, and the partial measuring elements 110-1 may be electrically connected to each other through wiring formed in the body 101a. Although three partial measuring elements 110-1 are illustrated in FIG. 3A, the measuring element 110a may be divided into two or four or more measuring elements 110-1 depending on the position of the post 180 or a partition wall in the body 101a and the type of components included in the measuring element 110a. Also, according to an embodiment, the measuring element 110a may have a single board form, like the measuring element 110 of the measuring apparatus 100 of FIG. 1. When the measuring element 110a has a single board form, the post 180 or the partition wall may be arranged on the board.

The sealing dam 170 may couple the upper body 101ta to the lower body 101ba at an outer portion of the body 101a and also seal the inside of the sealing dam 170 from the outside. Accordingly, the measuring element 110a may be sealed from the outside. Here, the sealing may mean that external plasma, chemicals, or the like is blocked from flowing into the body 101a. Accordingly, the sealing dam 170 may include an epoxy material or quartz resistant to plasma or chemicals. The sealing dam 170 may perform a function similar to the function of the adhesive layer 150 of the measuring apparatus 100 shown in FIG. 1. Unlike the adhesive layer 150, the sealing dam 170 may have a certain height to couple the upper body 101ta to the lower body 101ba, and thus, may help maintain a space S inside the body 101a.

The post 180 may be located or extend between the upper body 101*ta* and the lower body 101*ba* in the body 101*a* and support the upper body 101*ta* and the lower body 101*ba*, and thus, may help maintain the space S inside the body 101*a*. In other words, the post 180 may help maintain the shape of the space S in the body 101*a*, and thus, the body 101*a* may cope with or withstand an external vacuum, e.g., without a substantial change in shape of the body 101*a* due to the vacuum. Accordingly, posts 180 may be arranged in a proper number in the body 101*a* according to the width of the space S or the positions of the partial measuring elements 110-1 of the measuring element 110*a*.

A partition wall may be located in the body 101*a* instead of the post 180. The post 180 has the shape of a column and may help maintain the space S with a structure in which multiple spaces are connected to or communicate with each other. On the other hand, the partition wall may have the shape of or define a barrier and may divide the space S into several partial spaces and isolate the partial spaces from each other. The partition wall may also support the upper body 101*ta* and the lower body 101*ba* so that the body 101*a* may cope with or withstand an external vacuum, e.g., without a substantial change in shape of the body 101*a* due to the vacuum.

Although not shown in FIG. 3A, a protective layer may be formed on the lower surface of the lower body 101*ba* and a chucking metal layer may be formed on the upper surface of the upper body 101*ta*. According to an embodiment, a protective layer may be formed on the side surface of the sealing dam 170 and also on the upper surface of the upper body 101*ta*. Furthermore, wiring may be located through a via passing through the body 101*a*, for example, the lower body 101*ba*.

Figure 3B:
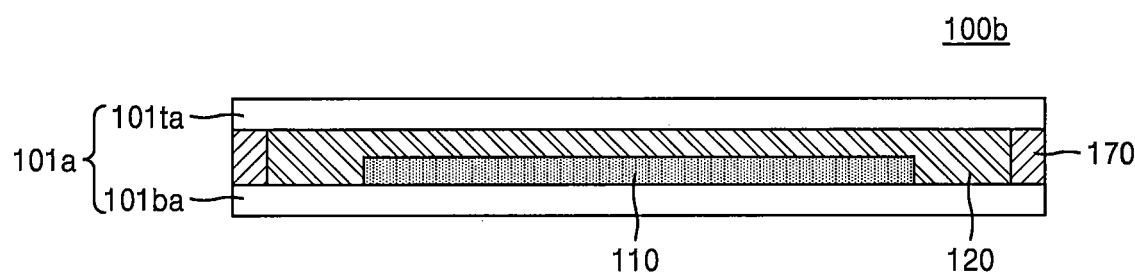

Referring to FIG. 3B, the measuring apparatus 100*b* according to the present embodiment may be similar to the measuring apparatus 100*a* of FIG. 3A in that the measuring apparatus 100*b* has a structure in which a sealing dam 170 is included therein. However, the measuring apparatus 100*b* according to the present embodiment is different from the measuring apparatus 100*a* of FIG. 3A in that a filler 120 may be located in a body 101*a* instead of the post 180. However, according to an embodiment, the post 180 and the filler 120 may be arranged together. The filler 120 allows the body 101*a* and/or a measuring element 110 to cope with or withstand an external vacuum, like the post 180. The description of the filler 120 is the same as or substantially the same as that of the filler 120 of the measuring apparatus 100 of FIG. 1.

The measuring element 110 in FIG. 3B has a single board form, but the measuring element 110 is not limited thereto and may have a structure in which the measuring element 110 is divided into partial measuring elements or a plurality of measuring elements, like the measuring element 110*a* of the measuring apparatus 100*a* of FIG. 3A. Also, in the measuring apparatus 100*b* according to the present embodiment, a protective layer, a chucking metal layer, a wiring, and the like may be further formed on the body 101*a*.

Figure 3C:
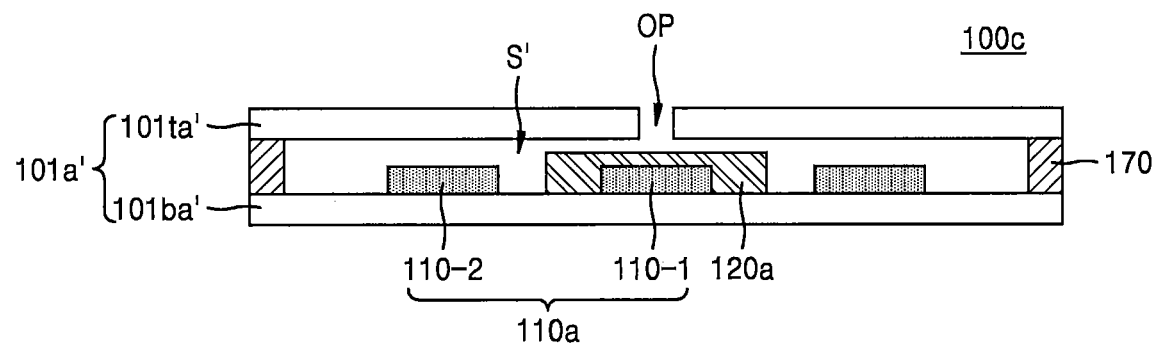

Referring to FIG. 3C, the measuring apparatus 100*c* according to the present embodiment may be similar to the measuring apparatus 100*a* of FIG. 3A in that the measuring apparatus 100*c* has a structure in which a sealing dam 170 is included therein. However, the measuring apparatus 100*c* according to the present embodiment may have a structure in which the inside of a body 101*a'* is not hermetically sealed from the outside. For example, an open hole OP may be formed in an upper body 101*ta'*, and a space S' inside the body 101*a'* may be connected to or communicate with an external space or outside the body 101*a'* through the open hole OP.

In the measuring apparatus 100*c* according to the present embodiment, a measuring element 110*a* may have a structure in which the measuring element 110*a* is divided into first and second partial measuring elements 110-1 and 110-2 or first and second measuring elements 110-1 and 110-2. Also, among the first and second partial measuring elements 110-1 and 110-2, the first partial measuring element 110-1 vulnerable to vacuum may be covered by a filler 120*a* and protected from external vacuum. The filler 120*a* may not be located on the second partial measuring element 110-2 having high resistance to vacuum.

For reference, the measuring element 110*a* may include a number of components, some of the components may be vulnerable (e.g., operationally vulnerable) to vacuum, and some may be resistant (e.g., operationally resistant) to vacuum. For example, an active element, such as a microcontroller unit (MCU) or an operational amplifier (Op-Amp), and a passive element, such as a resistor or a capacitor, may be designed to operationally cope with or withstand vacuum and be the second partial measuring element 110-2. Batteries may be generally operationally vulnerable to vacuum, and sensor chips that sense power, pressure, temperature, etc. may also be operationally vulnerable to vacuum. Accordingly, such components may be the first partial measuring element 110-1.

According to an embodiment, even when the measuring element 110*a* has a structure that the measuring element 110*a* is divided into the partial measuring elements 110-1 and 110-2 and the body 101*a'* has a structure in which the inside thereof is open through the open hole OP, all the partial measuring elements 110-1 and 110-2 may be covered by the filler 120 regardless of resistance to vacuum. Also in the measuring apparatus 100*c* according to the present embodiment, a protective layer, a chucking metal layer, a wiring, and the like may be further formed in the body 101*a'*.

Figure 3D:
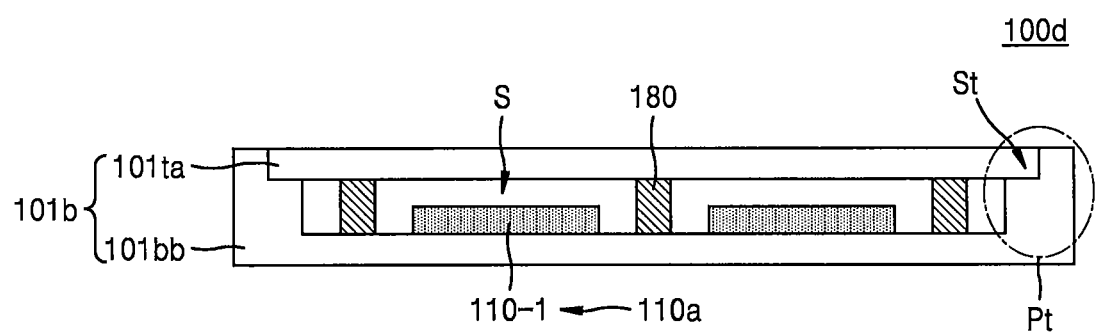

Referring to FIG. 3D, the measuring apparatus 100*d* according to the present embodiment may be different from the measuring apparatus 100*a* of FIG. 3A in that the measuring apparatus 100*d* has a structure in which an upwardly extending or protruding portion Pt is included at or in an outer portion of a lower body 101*bb* instead of the sealing dam 170. Specifically, in the measuring apparatus 100*d* according to the present embodiment, the lower body 101*bb* may have a '凹' shape by including the protruding portion Pt at an outer portion thereof. An upper body 101*ta* may have a flat plate shape and may be coupled with the protruding portion Pt of the lower body 101*bb* at an outer portion thereof.

As shown in FIG. 3D, a stepped portion St may be formed on the (inner) side of an upper portion of the protruding portion Pt of the lower body 101*bb*, and the upper body 101*ta* may be inserted into or received in the stepped portion St and coupled to the lower body 101*bb*. As the measuring apparatus 100*d* for a vacuum chamber has such a structure, the flatness of the outer surface of the body 101*b*, that is, the flatness of the outer surface of the protruding portion Pt of the lower body 101*bb* may increase and thus electrical and chemical stability may be improved. For example, when a coupled portion exists on the outer surface of the body 101*b* reducing the flatness, there may be a minute protrusion or recess in the coupled portion, and the electrical and chemical stability may be weak around the minute protrusion or recess (e.g., at an interface between the upper body 101*ta* and the lower body 101*bb*).

According to an embodiment, the stepped portion St may not be formed in the protruding portion Pt of the lower body 101*bb*. As such, when the stepped portion St is not formed, the upper body 101*ta* may be coupled to the lower body 101*bb* while covering the upper surface of the protruding portion Pt of the lower body 101*bb*. Also, according to an embodiment, a protruding portion may be formed in the upper body 101*ta* instead of the lower body 101*bb*, or may be formed in both the lower body 101*bb* and the upper body 101*ta*.

The protruding portion Pt of the lower body 101*bb* and the upper body 101*ta* may be coupled to each other through an adhesive layer. In addition, when the height of the protruding portion Pt of the lower body 101*bb* is relatively low, a sealing dam may be located between the protruding portion Pt and the upper body 101*ta*. Also in the measuring apparatus 100*d* according to the present embodiment, a protective layer, a chucking metal layer, a wiring, and the like may be further formed in the body 101*b*.

Figure 3E:
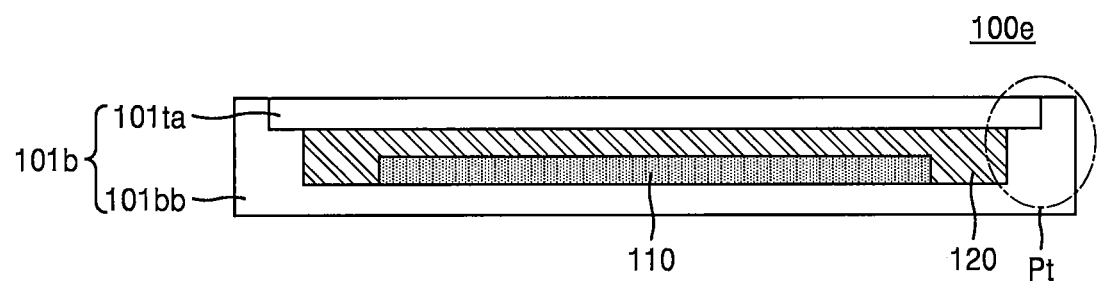

Referring to FIG. 3E, the measuring apparatus 100*e* according to the present embodiment may be similar to the measuring apparatus 100*d* of FIG. 3D in that the measuring apparatus 100*e* has a structure in which an outer portion of a lower body 101*bb* includes a protruding portion Pt. However, in the measuring apparatus 100*e* according to the present embodiment, a filler 120 may fill a space inside the body 101*b*. In other words, the space inside the body 101*b* may be filled with the filler 120 instead of a post to cope with or withstand a vacuum.

Also in the measuring apparatus 100*e* according to the present embodiment, a stepped portion may not be formed in the protruding portion Pt of the lower body 101*bb*. In addition, the protruding portion Pt may be formed in an upper body 101*ta* instead of the lower body 101*bb*, or may be formed in both the lower body 101*bb* and the upper body 101*ta*. Also in the measuring apparatus 100*e* according to the present embodiment, a protective layer, a chucking metal layer, a wiring, and the like may be further formed in the body 101*b*.

Figure 4A:
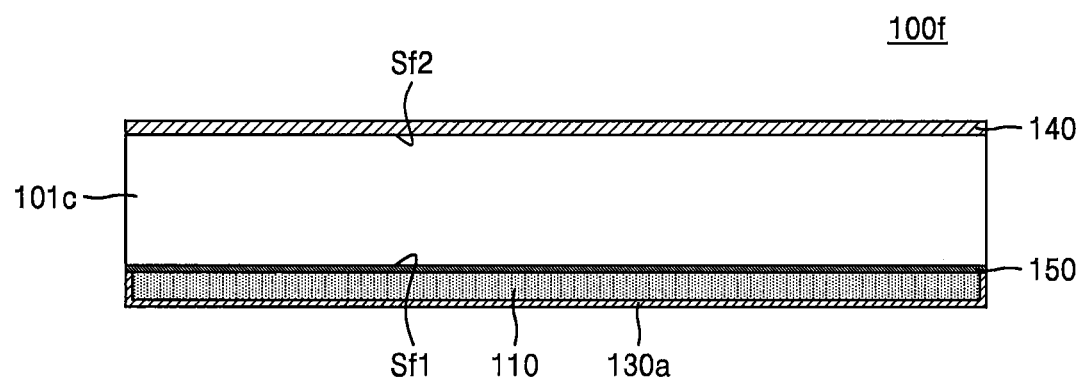
FIGS. 4A and 4B are cross-sectional views of measuring apparatuses for vacuum chambers, according to embodiments of the inventive concept.
Figure 4B:
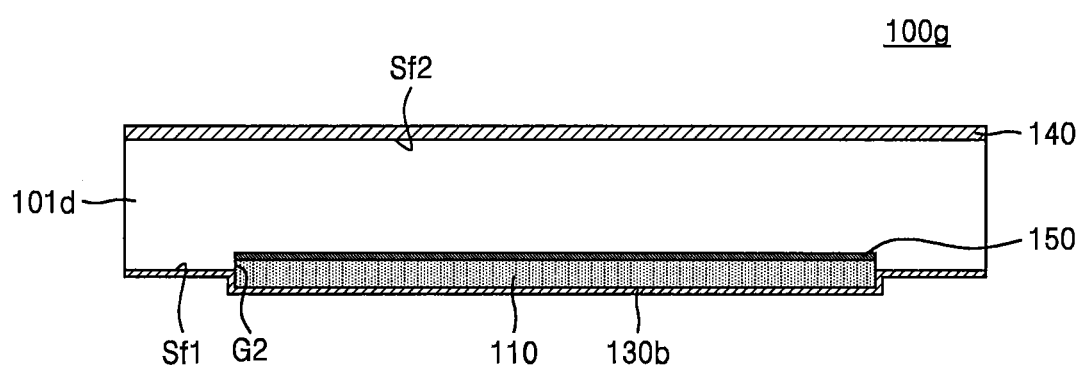

FIGS. 4A and 4B are cross-sectional views of measuring apparatuses or measuring devices 100*f* and 100*g* for vacuum chambers according to embodiments of the inventive concept. Descriptions already given above with reference to FIGS. 1 to 3E may be briefly described or omitted in the interest of brevity.

Referring to FIG. 4A, the measuring apparatus 100*f* according to the present embodiment may be different from the measuring apparatuses 100 and 100*a* to 100*e* for vacuum chambers in terms of the structure of a body 101*c* and the arrangement position of a measuring element 110 on the body 101*c*. Specifically, in the measuring apparatus 100*f* according to the present embodiment, the body 101*c* may have a single-body structure or shape (e.g., the body may be monolithic). The material and the outer shape of the body 101*c* are the same as those of the body 101 of the measuring apparatus 100 of FIG. 1, except that the body 101*c* has the single-body shape. For example, the body 101*c* may have a flat plate shape similar to that of the exposure mask.

The measuring element 110 may be located on a lower surface Sf1 of the body 101*c*. As shown in FIG. 4A, the measuring element 110 may have a structure similar to that of a single board and may be adhesively bonded onto the lower surface Sf1 of the body 101*c* by or through an adhesive layer 150. The function and structure of the measuring element 110 may be the same as those of the measuring element 110 of the measuring apparatus 100 of FIG. 1.

A protective layer 130*a* may be formed on the lower or bottom surface and the side surface of the measuring element 110. Although not shown in FIG. 4A, the protective layer 130*a* may include a plurality of protective layers, similar to the protective layer 130 of the measuring apparatus 100 of FIG. 1. For example, the protective layer 130*a* may include a EUV protective layer and a plasma and/or chemical protective layer. The measuring element 110 may be protected from EUV light, plasma, chemicals, etc. by or through the protective layer 130*a*. The material of the protective layer 130*a* may be the same as that of the protective layer 130 of the measuring apparatus 100 of FIG. 1.

A chucking metal layer 140 may be formed on an upper surface Sf2 of the body 101*c*. According to an embodiment, the protective layer 130*a* may also be formed on the upper surface Sf2 of the body 101*c*.

Referring to FIG. 4B, the measuring apparatus 100*g* according to the present embodiment may be similar to the measuring apparatus 100*f* of FIG. 4A in that a body 101*d* has a single-body shape or structure and a measuring element 110 is located on a lower surface Sf1 of the body 101*d*. However, in the measuring apparatus 100*g* according to the present embodiment, a second groove or recess G2 may be formed in the lower surface Sf1 of the body 101*d* or the lower surface Sf1 of the body 101*d* may define the second groove or recess G2. Also, the measuring element 110 may be located on the lower surface Sf1 of the body 101*d* with a structure in which the measuring element 110 is in the second groove G2. The measuring element 110 may be adhesively bonded in or to the second groove G2 of the body 101*d* by or through an adhesive layer 150.

A protective layer 130*b* may be formed on the lower or bottom surface and the side surface of the measuring element 110. The protective layer 130*b* may extend from the lower and side surfaces of the measuring element 110 and also be formed on the lower surface Sf1 of the body 101*d*. The protective layer 130*b* may include a plurality of layers. The protective layer 130*b* may include a EUV protective layer and a plasma and/or chemical protective layer. The material and function of the protective layer 130*b* may be the same as those of the protective layers 130 and 130*a* of the measuring apparatuses 100 and 100*f* of FIGS. 1 and 4A.

A chucking metal layer 140 may be formed on an upper surface Sf2 of the body 101*d*. According to an embodiment, the protective layer 130*b* may also be formed on the upper surface Sf2 of the body 101*d*.

Figure 5:
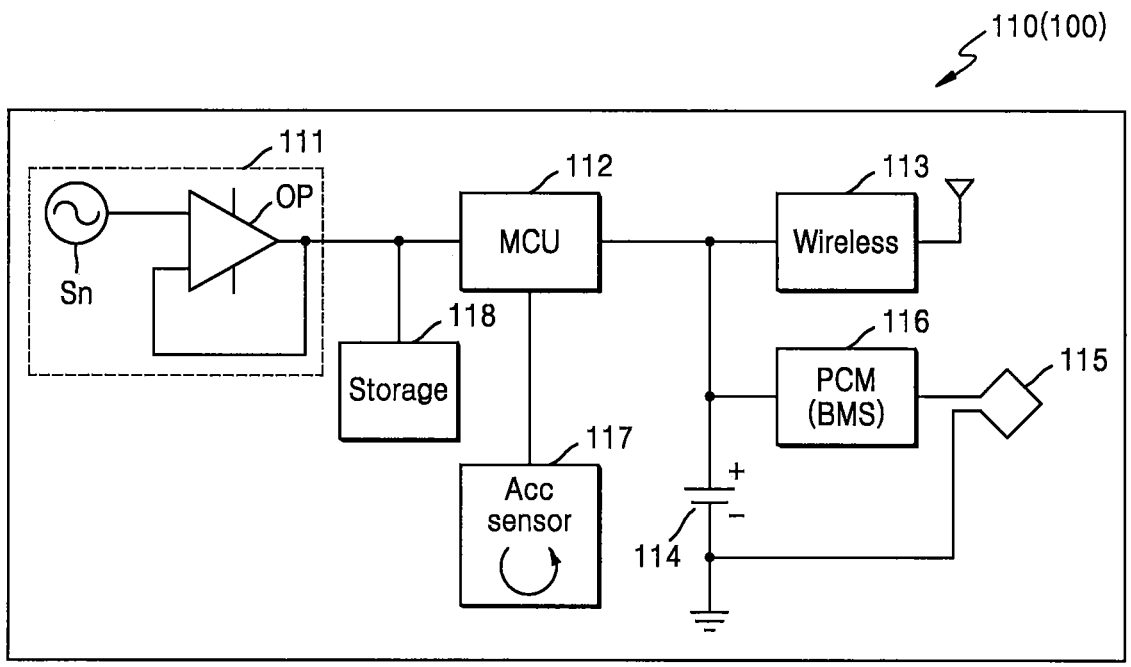
FIG. 5 is a circuit diagram showing components included in a measuring element in the measuring apparatus of FIG. 1.

FIG. 5 is a circuit diagram showing components included in the measuring element 110 in the measuring apparatus 100 of FIG. 1. The components will be described with reference to FIG. 1 and FIG. 2 as well as FIG. 5, and descriptions already given above with reference to FIGS. 1 to 4B may be briefly described or omitted in the interest of brevity.

Referring to FIG. 5, in the measuring apparatus 100 according to the present embodiment, the measuring element 110 may include a sensor 111, a micro-controller or micro-controller unit (MCU) 112, an antenna or antenna module 113, a battery 114, a charging coil 115, a protection circuit module (PCM) 116, an acceleration sensor 117, and a memory or storage 118.

The sensor 111 may be a sensor for sensing various physical properties or quantities in the vacuum chamber 201. For example, the sensor 111 may sense the electric field, temperature, IR, pressure, intensity of light, characteristics of light, and the like in the vacuum chamber 201. However, the physical quantities that may be sensed by the sensor 111 are not limited to the physical quantities described above. The sensor 111 is represented, in FIG. 5, by a signal Sn detected by a sensor and an Op-Amp OP for amplifying the signal, but the sensor 111 may include various additional components depending on characteristics of physical quantities to be sensed.

For reference, a single sensor may not sense all the physical properties or quantities at once, and a sensor 111 having a specific function may be mounted on a measuring element 110 having a board shape to measure a corresponding physical quantity. For example, a measuring element 110 including a sensor 111 having a function corresponding to a physical quantity to be sensed may be prepared, and the measuring element 110 may be put into the vacuum chamber 201 to measure the physical quantity. However, according to an embodiment, at least two sensors having different functions may be mounted on the measuring element 110, and accordingly the measuring element 110 may measure different physical quantities at the same time by using the at least two sensors.

The MCU 112 may process a signal measured by the sensor 111. For example, the MCU 112 may convert an analog signal from the sensor 111 into a digital signal. Data processed through the MCU 112 may be stored in the storage 118. The antenna module 113 may transmit and receive data to and from an external device via wireless communication. For example, the antenna module 113 may transmit data processed by or through the MCU 112 or data stored in the storage 118 to an external device via wireless communication.

The battery 114 may supply power to each component in the measuring element 110. The battery 114 may be wirelessly charged through the charging coil 115. However, according to an embodiment, the battery 114 may be directly charged through a wire. The battery 114 may be embodied as a solid-state battery, or may be covered and protected by a battery shielding material including an insulating material. Accordingly, the battery 114 may be used without damage in a high temperature environment in the vacuum chamber 201. The battery 114 may be controlled to charge and discharge through the PCM 116. The PCM 116 may also be referred to as a power management integrated circuit (PMIC) in a broader sense. Also, the function of the PCM 116 may be performed through a battery management system (BMS). The BMS performs functions similar to those of the PCM 116 but may perform more functions than the PCM 116. For example, the BMS may perform an overcharge protection function, an over discharge protection function, an overcurrent shutdown function, and may further perform a balancing function to reduce voltage deviation between cells of the battery.

The acceleration sensor 117 may measure data related to position and state, for example, the speed, vibration, and rotation of a sensor in a blind spot in facilities, and may estimate the position and the state by using the measured data. For example, when acceleration information is integrated, velocity information may be obtained, and the position may be estimated by integrating the velocity information. Here, the position may denote the position of the measuring apparatus 100 or the measuring element 110 which includes the acceleration sensor 117. As such, by adding the acceleration sensor 117 to the measuring element 110, it is possible not only to measure physical quantities related to yield inside the facilities, but also to estimate the position and the state where the data is measured. A gyro sensor may be included in the measuring element 110. For example, the speed, vibration, impact, etc. of the sensor may be measured through the acceleration sensor 117, and the rotation of the sensor may be measured using a gyro sensor for measuring an angular velocity.

In addition, instead of estimating the position through integral calculation by the acceleration sensor 117, it is also possible to estimate the position by detecting characteristics at corresponding positions. For example, when a rise occurs at a first position and a rotation occurs at a second position, it may be estimated that, when the rise is detected, the measuring element 110 is at the first position, and when the rotation is detected, the measuring element 110 is at the second position.

Figure 6:
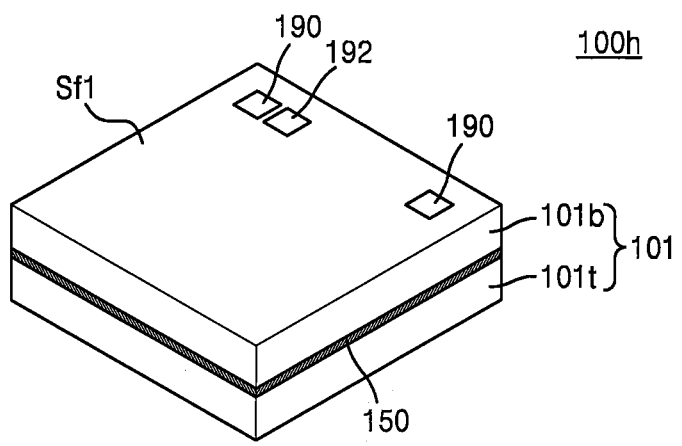
FIG. 6 is a perspective view of a measuring apparatus for a vacuum chamber, according to an embodiment of the inventive concept.

FIG. 6 is a perspective view of a measuring apparatus 100h for a vacuum chamber, according to an embodiment of the inventive concept. The measuring apparatus 100h will be described with reference to FIG. 2 as well as FIG. 6, and descriptions already given above with reference to FIGS. 1 to 5 may be briefly described or omitted in the interest of brevity.

Referring to FIG. 6, the measuring apparatus 100h according to the present embodiment may be different from the measuring apparatus 100 of FIG. 1 in that the measuring apparatus 100h further includes at least one alignment mark 190 formed on a lower surface Sf1 of a body 101. That is, the measuring apparatus 100h according to the present embodiment may include the alignment mark 190 on the lower surface Sf1 of the body 101 so that the measuring apparatus 100h may be put into and used in exposure equipment in an actual exposure process. As described above, the lower surface Sf1 of the body 101 may denote a surface irradiated with EUV light when the measuring apparatus 100h for a vacuum chamber is mounted on the electrostatic chuck 210 in the vacuum chamber 201.

For reference, in general, the alignment mark denotes a pattern formed on the surface of an exposure mask to recognize and align the exposure mask in an exposure process while and after the exposure mask is put into exposure equipment. When such an alignment mark is not present in a measuring apparatus, the measuring apparatus may not be placed and/or operate in an exposure apparatus such as a vacuum chamber in an actual exposure process.

The measuring apparatus 100h according to the present embodiment may have substantially the same shape as the exposure mask, and the position and shape of the alignment mark 190 on the lower surface Sf1 may be the same as or similar to the position and shape of an alignment mark of the exposure mask required by or in a scanner of the exposure equipment. Accordingly, the measuring apparatus 100h according to the present embodiment may be recognized and aligned in substantially the same manner as the exposure mask in the exposure process.

The alignment mark 190 may have, for example, a cross shape, or a shape in which two cross shapes are combined together in a staggered manner. In addition, the shape of the alignment mark 190 is not limited to the cross shape and the alignment mark 190 may have various shapes. For example, the alignment mark 190 may have various shapes, such as a shape in which line patterns extend in one direction, a shape in which line patterns are arranged in a rectangular ring pattern, and a shape in which line patterns in different directions are combined.

The measuring apparatus 100h according to the present embodiment may further include a barcode 192 located adjacent the alignment mark 190 on the lower surface Sf1 of the body 101. The bar code 192 may be a recognition indication or indicia such as or providing the ID of the measuring apparatus 100h for a vacuum chamber. Therefore, the measuring apparatus 100h according to the present embodiment may be managed with an ID through the bar code 192, like the exposure mask.

The positions, shapes, and sizes of the alignment mark 190 and the barcode 192 may be substantially the same as positions, shapes, and sizes required in the exposure equipment. However, according to an embodiment, as long as recognized in the exposure equipment, the shapes and sizes may be arbitrary shapes and sizes to some extent.

The body 101, the adhesive layer 150, and the like may be the same as those of the measuring apparatus 100 of FIG. 1. In FIG. 6, a chucking metal layer and a protective layer are omitted and a measuring element is located inside the body 101 but is not shown. The measuring apparatus 100h according to the present embodiment is not limited to the structure of the measuring apparatus 100 of FIG. 1, but it may have the same structure as any one of the measuring apparatuses 100a to 100g of FIGS. 3A to 4B. For example, when the measuring apparatus 100h according to the present embodiment has the same structure as the measuring apparatus 100a of FIG. 3A, a sealing dam 170 may be located between an upper body 101t and a lower body 101b.

As the measuring apparatus 100h according to the present embodiment includes the alignment mark 190 that is substantially the same as the alignment mark of the exposure mask, the measuring apparatus 100h may be put into the vacuum chamber 201 in the exposure process, like the exposure mask, to measure physical properties or quantities in the vacuum chamber 201 in real time. In addition, as the measuring apparatus 100h according to the present embodiment further include the bar code 192 as a recognition mark, the measuring apparatus 100h may be managed with an ID, like the exposure mask.

Figure 7:
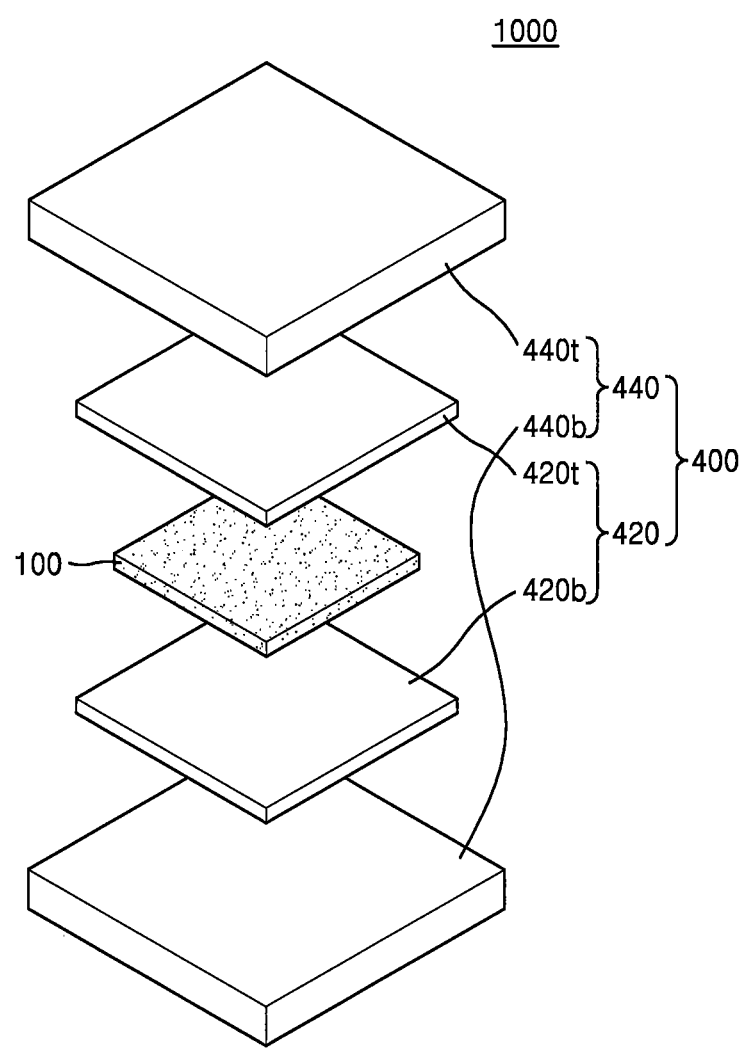
FIG. 7 is a perspective view of a measuring system including a measuring apparatus for a vacuum chamber, according to an embodiment of the inventive concept.

FIG. 7 is a perspective view of a measuring system 1000 including a measuring apparatus for a vacuum chamber, according to an embodiment of the inventive concept. Descriptions already given above with reference to FIGS. 1 to 6 may be briefly described or omitted in the interest of brevity.

Referring to FIG. 7, the measuring system 1000 according to the present embodiment may include a measuring apparatus 100 for a vacuum chamber and a carrier 400. The measuring apparatus 100 for a vacuum chamber may be, for example, the measuring apparatus 100 of FIG. 1. However, the present disclosure is not limited thereto and the measuring apparatus 100 for a vacuum chamber may be any one of the measuring apparatuses 100a to 100h of FIGS. 3A to 4B and 6.

The carrier 400 may be a device for receiving and storing the measuring apparatus 100 for a vacuum chamber and moving it into a vacuum chamber (e.g., the vacuum chamber 201 of FIG. 2) of exposure equipment. For example, the carrier 400 may be transported by an exposure mask transport robot from the outside of the exposure equipment into the vacuum chamber of the exposure equipment.

The carrier 400 may include an inner pod 420 and an outer pod 440. The inner pod 420 may include an upper inner pod 420t and a lower inner pod 420b. The upper inner pod 420t may be referred to as a cover of the inner pod 420 and the lower inner pod 420b may be referred to as a base of the inner pod 420. The outer pod 440 may also include an upper outer pod 440t and a lower outer pod 440b. The upper outer pod 440t may be referred to as a carrier shell and the lower outer pod 440b may be referred to as a carrier door. As shown in FIG. 7, the measuring apparatus 100 for a vacuum chamber may be located between the upper inner pod 420t and the lower inner pod 420b.

For reference, an exposure mask is accommodated in the carrier 400 and is put into a vacuum chamber (e.g., the vacuum chamber 201 of FIG. 2) in high vacuum, in which an actual exposure process is performed, through several chambers. In this case, pressure is lowered through each chamber, and the exposure mask is mounted on an electrostatic chuck (e.g., the electrostatic chuck 210 in FIG. 2) of the vacuum chamber 201 while the outer pod 440 and the inner pod 420 are sequentially removed. As the measuring system 1000 according to the present embodiment includes the measuring apparatus 100 for a vacuum chamber and the carrier 400, the measuring apparatus 100 for a vacuum chamber may be mounted on the electrostatic chuck 210 of the vacuum chamber 201 through substantially the same process as the exposure mask.

The carrier 400 may not only store and transport the measuring apparatus 100 for a vacuum chamber, but also may charge the measuring apparatus 100 for a vacuum chamber. A circuit or circuit portion CK (see FIG. 8) for charging the measuring apparatus 100 for a vacuum chamber may be included in the inner pod 420. The circuit portion CK included in the inner pod 420 will be described in more detail with reference to FIG. 8. The carrier 400 may also include a display device such as a display or light-emitting diode (LED) indicator capable of displaying the state of the measuring apparatus 100 for a vacuum chamber. The display device may be located, for example, in the outer pod 440 of the carrier 400.

As the measuring system 1000 according to the present embodiment includes the measuring apparatus 100 for a vacuum chamber and the carrier 400, the measuring apparatus 100 for a vacuum chamber may be put into the vacuum chamber 201 through substantially the same process as the exposure mask, and as the measuring system 1000 according to the present embodiment allows the carrier 400 to charge the measuring apparatus 100 for a vacuum chamber, the usability of the measuring apparatus 100 for a vacuum chamber may be enhanced.

Figure 8:
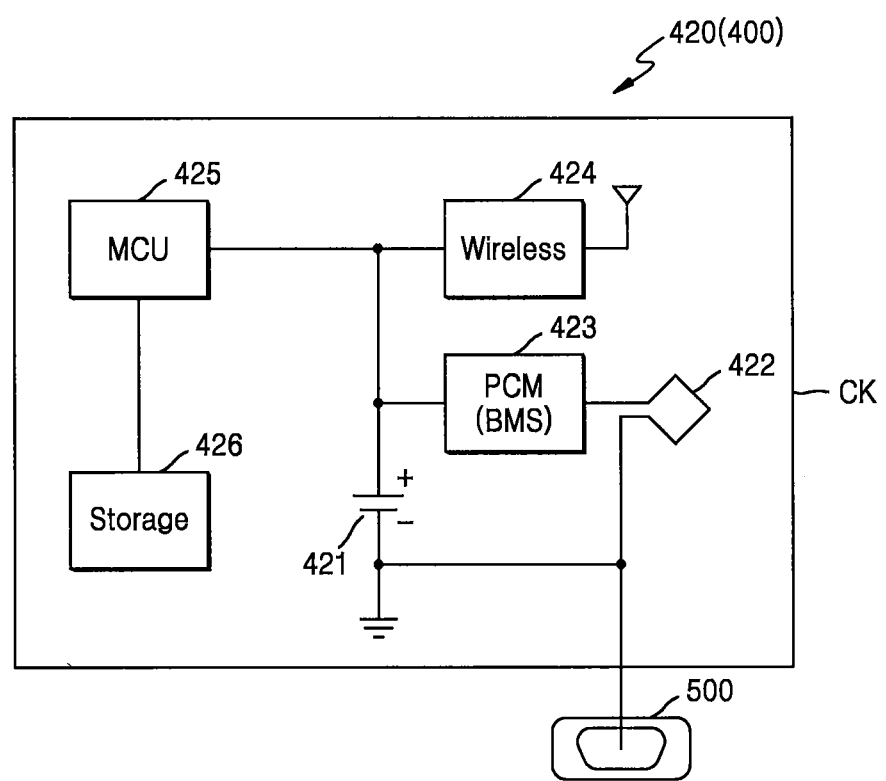
FIG. 8 is a circuit diagram showing components included in a carrier in the measuring system of FIG. 7.

FIG. 8 is a circuit diagram showing components that may be included in the carrier 400 in the measuring system 1000 of FIG. 7. The components will be described with reference to FIG. 7 and FIG. 8, and descriptions already given above with reference to FIGS. 1 to 7 may be briefly described or omitted in the interest of brevity.

Referring to FIG. 8, the inner pod 420 of the carrier 400 of the measuring system 1000 according to the present embodiment may include a circuit or circuit portion CK. The circuit portion CK may be included in the upper inner pod 420t or the lower inner pod 420b. However, according to an embodiment, the circuit portion CK may be included in both the upper inner pod 420t and the lower inner pod 420b.

The circuit portion CK may include a battery 421, a wireless charging coil 422, and/or an external power source 500, a PCM 423, an antenna or antenna module 424, an MCU 425, and a memory or storage 426. The battery 421 may supply power to each of the components of the circuit portion CK. The wireless charging coil 422 and/or the external power source 500 may charge the battery 421 wirelessly or via wire. A transmitting portion in addition to a receiving portion may be added to the wireless charging coil 422, and thus, the wireless charging coil 422 may charge the measuring apparatus 100 for a vacuum chamber. The battery 421 may be controlled to charge and discharge through the PCM 423 or a BMS. The battery 421 may be made as a solid-state battery or be protected by a battery shielding material including an insulating material, and thus may operate at a high temperature.

The MCU 425 may process data, and the storage 426 may store data. The data stored in the storage 426 may be data processed through the MCU 425, or may be data transmitted from the outside. The antenna module 424 may transmit and receive data to and from the measuring apparatus 100 for a vacuum chamber through wireless communication such as Bluetooth low energy (BLE) and wireless fidelity (WIFI). In addition, according to an embodiment, the circuit portion CK may transmit and receive data to and from the measuring apparatus 100 for a vacuum chamber through wire communication such as an inter integrated circuit (I2C) and a serial peripheral interface (SPI).

While the inventive concept has been particularly shown and described with reference to embodiments thereof, it will be understood that various changes in form and details may be made therein without departing from the spirit and scope of the following claims.

What is claimed is:

1. A measuring apparatus for a vacuum chamber, the measuring apparatus comprising:
   a body having a shape of an exposure mask used in an exposure process; and
   a measuring element in an interior of the body,
   wherein, when the measuring apparatus is positioned in a vacuum chamber during the exposure process, the measuring apparatus is configured to measure physical properties in the vacuum chamber using the measuring element,
   wherein the body or the measuring element is configured to resist or prevent physical deformation of the body or the measuring element due to a vacuum in the vacuum chamber, and wherein:
   the body includes an upper body and a lower body,
   the upper body and the lower body are spaced apart from each other, the body including a space therein,
   the measuring element is in a first portion of the space,
   a second portion of the space not including the measuring element is at least partially filled with a filler,
   posts or partition walls extend between the upper body and the lower body, and
   the measuring element is between the posts or between the partition walls.

2. The measuring apparatus of claim 1, wherein the body has a structure selected from:
   a first structure in which both the upper body and the lower body have a flat plate shape, a groove, in which the measuring element is located, is defined between the upper body and the lower body, and the upper body and the lower body are coupled to one another by an adhesive layer at outer portions of the upper body and the lower body,
   a second structure in which both the upper body and the lower body have a flat plate shape and are coupled to one another by a sealing dam extending between the upper body and the lower body at outer portions of the upper body and the lower body, and
   a third structure in which the lower body has a U shape, the upper body has a flat plate shape, and the upper body is coupled to an upwardly protruding portion of the lower body at an outer portion of the upper body.

3. The measuring apparatus of claim 1, further comprising:
   a chucking metal layer on a second surface of the body that is opposite a first surface of the body.

4. The measuring apparatus of claim 1, further comprising:
   a protective layer on a first surface of the body for protection from extreme ultra-violet (EUV) light and plasma or chemicals,
   wherein the protective layer includes multiple layers, and the protective layer includes a first protective layer for protection from the EUV light and a second protective layer for protection from the plasma or chemicals.

5. The measuring apparatus of claim 1, further comprising:
   a wiring extending through a via passing through a portion of the body,
   wherein the wiring is configured to electrically connect the measuring element to an external device.

6. The measuring apparatus of claim 1, wherein the measuring element includes:
   at least one sensor configured to sense the physical properties in the vacuum chamber, a micro-controller unit (MCU) configured to process a signal measured by the sensor, an antenna module configured to wirelessly communicate with an external device, a storage device configured to store data, a battery configured to supply power, and a charging coil configured to wirelessly charge the battery.

7. The measuring apparatus of claim 1, further comprising:
   an alignment mark on a first surface of the body corresponding to an alignment mark of the exposure mask,
   wherein the first surface of the body is a surface to which extreme ultra-violet (EUV) light is irradiated and from which the EUV light is reflected.

8. The measuring apparatus of claim 1, wherein the second portion of the space is completely filled with the filler.

9. A measuring apparatus for a vacuum chamber, the measuring apparatus comprising:
   a body having a shape of an exposure mask used in an exposure process; and
   a measuring element in an interior of the body,
   wherein, when the measuring apparatus is positioned in a vacuum chamber during the exposure process, the measuring apparatus is configured to measure physical properties in the vacuum chamber using the measuring element,
   wherein the body or the measuring element is configured to resist or prevent physical deformation of the body or the measuring element due to a vacuum in the vacuum chamber, and wherein:
   the body includes an upper body and a lower body,
   the upper body and the lower body are spaced apart from each other, the body including a space therein,
   the measuring element is in a first portion of the space,
   a second portion of the space not including the measuring element is at least partially filled with a filler,
   the space is open to the outside through a hole defined in the upper body, and
   at least a portion of the measuring element is covered with the filler to resist or prevent physical deformation of the measuring element due to the vacuum in the vacuum chamber.

10. A measuring apparatus for a vacuum chamber, the measuring apparatus comprising:
    a measuring element;
    a body having a shape of an exposure mask, wherein the measuring element is in an interior of the body or on a first surface of the body to which extreme ultra-violet (EUV) light is irradiated and from which the EUV light is reflected; and at least one alignment mark on the first surface of the body, wherein the measuring apparatus is configured to be positioned in a vacuum chamber during an exposure process and to measure physical properties in the vacuum chamber using the measuring element, and wherein, when the measuring apparatus is positioned in the vacuum chamber, an alignment state of the measuring apparatus in the vacuum chamber is checked using the alignment mark.

11. The measuring apparatus of claim 10, wherein
the alignment mark is located in a position of the body corresponding to a position that is substantially the same as a position of the exposure mask at which an alignment mark of the exposure mask is located on the exposure mask.

12. The measuring apparatus of claim 10, wherein
a barcode is adjacent the alignment mark.

13. The measuring apparatus of claim 10, wherein the body includes an upper body and a lower body, and wherein the body has a structure selected from:

a first structure in which both the upper body and the lower body have a flat plate shape, a groove, in which the measuring element is located, is defined between the upper body and the lower body, and the upper body and the lower body are coupled to one another by an adhesive layer at outer portions of the upper body and the lower body, a second structure in which both the upper body and the lower body have a flat plate shape and are coupled to one another by a sealing dam extending between the upper body and the lower body at outer portions of the upper body and the lower body, and a third structure in which the lower body has a U shape, the upper body has a flat plate shape, and the upper body is coupled to an upwardly protruding portion of the lower body at an outer portion of the upper body.

14. The measuring apparatus of claim 10, wherein
the body has a single-body shape, and
the measuring element is on a lower surface of the body as the first surface of the body.

15. The measuring apparatus of claim 14, wherein
a groove is defined in the lower surface of the body, and the measuring element is in the groove.

* * * * *